(12) United States Patent
Farnworth et al.

(10) Patent No.: US 6,313,658 B1
(45) Date of Patent: Nov. 6, 2001

(54) DEVICE AND METHOD FOR ISOLATING A SHORT-CIRCUITED INTEGRATED CIRCUIT (IC) FROM OTHER IC'S ON A SEMICONDUCTOR WAFER

(75) Inventors: Warren M. Farnworth, Nampa, ID (US); William K. Waller, Garland, TX (US); Leland R. Nevill, Boise, ID (US); Raymond J. Beffa, Boise, ID (US); Eugene H. Cloud, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/083,819

(22) Filed: May 22, 1998

(51) Int. Cl.⁷ ..................................................... G01R 31/26
(52) U.S. Cl. ........................................... 324/765; 324/769
(58) Field of Search .................................. 324/765, 763, 324/73.1, 158.1, 760; 714/733, 734

(56) References Cited

U.S. PATENT DOCUMENTS

| | | | |
|---|---|---|---|
| 4,743,841 | * 5/1988 | Takeuchi | 324/763 |
| 4,967,151 | * 10/1990 | Barish et al. | 324/765 |
| 4,970,454 | * 11/1990 | Stambaugh et al. | 324/73.1 |
| 5,059,899 | 10/1991 | Farnworth et al. . | |
| 5,105,362 | 4/1992 | Kotani . | |
| 5,214,657 | 5/1993 | Farnworth et al. . | |
| 5,289,113 | 2/1994 | Meaney et al. . | |
| 5,294,883 | * 3/1994 | Akiki et al. | 324/158.1 |
| 5,568,408 | 10/1996 | Maeda . | |
| 5,838,163 | * 11/1998 | Rostoker et al. | 324/763 |
| 5,898,700 | * 4/1999 | Kim | 371/21.1 |
| 5,994,912 | * 11/1999 | Whetsel | 324/763 |

\* cited by examiner

*Primary Examiner*—Ernest Karlsen
*Assistant Examiner*—Minh Tang
(74) *Attorney, Agent, or Firm*—TraskBritt

(57) ABSTRACT

A circuit for isolating a short-circuited integrated circuit (IC) formed on the surface of a semiconductor wafer from other ICs formed on the wafer that are interconnected with the short-circuited IC includes control circuitry within the short-circuited IC for sensing the short circuit. The control circuitry may sense the short circuit in a variety of ways, including sensing excessive current drawn by the short-circuited IC, and sensing an abnormally low or high voltage within the short-circuited IC. Switching circuitry also within the short-circuited IC selectively isolates the short-circuited IC from the other ICs on the wafer in response to the control circuitry sensing the short circuit. As a result, if the wafer is under probe test, for example, testing can continue uninterrupted on the other ICs while the short-circuited IC is isolated.

17 Claims, 6 Drawing Sheets

DEVICE AND METHOD FOR ISOLATING A SHORT-CIRCUITED INTEGRATED CIRCUIT (IC) FROM OTHER IC'S ON A SEMICONDUCTOR WAFER

BACKGROUND

1. Field of the Invention

This invention relates in general to integrated circuits (ICs) fabricated on semiconductor wafers, and, more specifically, to devices and methods for isolating a short-circuited IC from other ICs on a semiconductor wafer so that, for example, probe testing may proceed on the other ICs on the wafer despite the presence of the short-circuited IC.

2. State of the Art

As shown in FIG. 1, integrated circuits (ICs) 10 are small electronic circuits formed on the surface of a wafer 12 of semiconductor material, such as silicon, in an IC manufacturing process referred to as "fabrication." Once fabricated, ICs 10 are electronically probed to evaluate a variety of their electronic characteristics. Probing typically involves positioning needle-like probes (not shown) onto bond pads 14 on the surfaces of ICs 10 to test the ICs 10 using various electronic signals supplied through the probes. As described in U.S. Pat. Nos. 5,059,899 and 5,214,657 to Farnworth et al., in some cases, ICs 10 are tested using test probes that contact probe pads 16 positioned on the surface of a semiconductor wafer 12 rather than, or in addition to, contacting bond pads 14 on the ICs 10.

Sometimes shorts develop in some of the ICs 10 on a semiconductor wafer 12 as a result of fabrication errors. These shorts can interfere with the probe testing described above in a variety of ways. For example, in some instances, a supply voltage $V_{cc}$, provided to ICs 10 on a wafer 12 through probes contacting bond pads 14 on the ICs 10 or probe pads 16 on the wafer 12, may be shorted to ground through one of the ICs 10. As a result, over-current protection circuitry, such as a fuse, present in testing equipment that provides the supply voltage $V_{cc}$ to the probes, will likely "trip" the equipment off-line, causing a brief but significant delay in the manufacturing of ICs 10 while the equipment is reset. In addition, such a $V_{cc}$-to-ground short in an IC 10 may make the entire wafer 12 untestable until the IC 10 with the short is identified and either repaired or disconnected, which involves a separate manual process that can cause additional delays in the manufacturing process.

In other instances, a test signal $V_{TEST}$ supplied to a group of ICs 10 on a semiconductor wafer 12 through a probe pad 16 on the wafer 12 may be distorted for all of the ICs 10 in the group by, for example, a $V_{TEST}$-to-ground or a $V_{TEST}$-to-$V_{cc}$ short in one of the ICs 10 in the group. This distortion may interfere with probe testing of all of the ICs 10 in the group, and may require that the IC 10 with the short be manually identified and repaired or disconnected before the ICs 10 in the group can be successfully probe tested.

Therefore, there is a need in the art for a device and method for isolating a short-circuited IC on a semiconductor wafer from other ICs on the wafer. Preferably, such a device and method should isolate a short-circuited IC before the IC interferes with probe testing of other ICs so the probe testing can continue uninterrupted.

SUMMARY OF THE INVENTION

An inventive device for isolating a short-circuited integrated circuit (IC) from other ICs formed on the surface of a semiconductor wafer that are interconnected with the short-circuited IC includes control circuitry within the short-circuited IC for sensing the short circuit. The control circuitry may sense the short circuit in a variety of ways, including sensing excessive current drawn by the short-circuited IC, and sensing an abnormally low or high voltage within the short-circuited IC. Switching circuitry also within the short-circuited IC selectively isolates the short-circuited IC from the other ICs on the wafer in response to the control circuitry sensing the short circuit. As a result, if the wafer is under probe test, for example, testing can continue uninterrupted on the other ICs while the short-circuited IC is isolated.

Further embodiments of the present invention are directed to an IC including the control and switching circuitry described above, a semiconductor wafer including many of these ICs, and an electronic system, such as a computer system, including at least one of these ICs.

In an inventive method for testing ICs formed on the surface of a semiconductor wafer, control circuitry is provided in the ICs for sensing shorts in the ICs. The ICs are then tested, and if the control circuitry in one of the ICs senses a short, the short-circuiting IC is automatically switchably isolated from the other ICs.

DETAILED DESCRIPTION OF THE PREFERRED EMBODIMENTS

Figure 1:
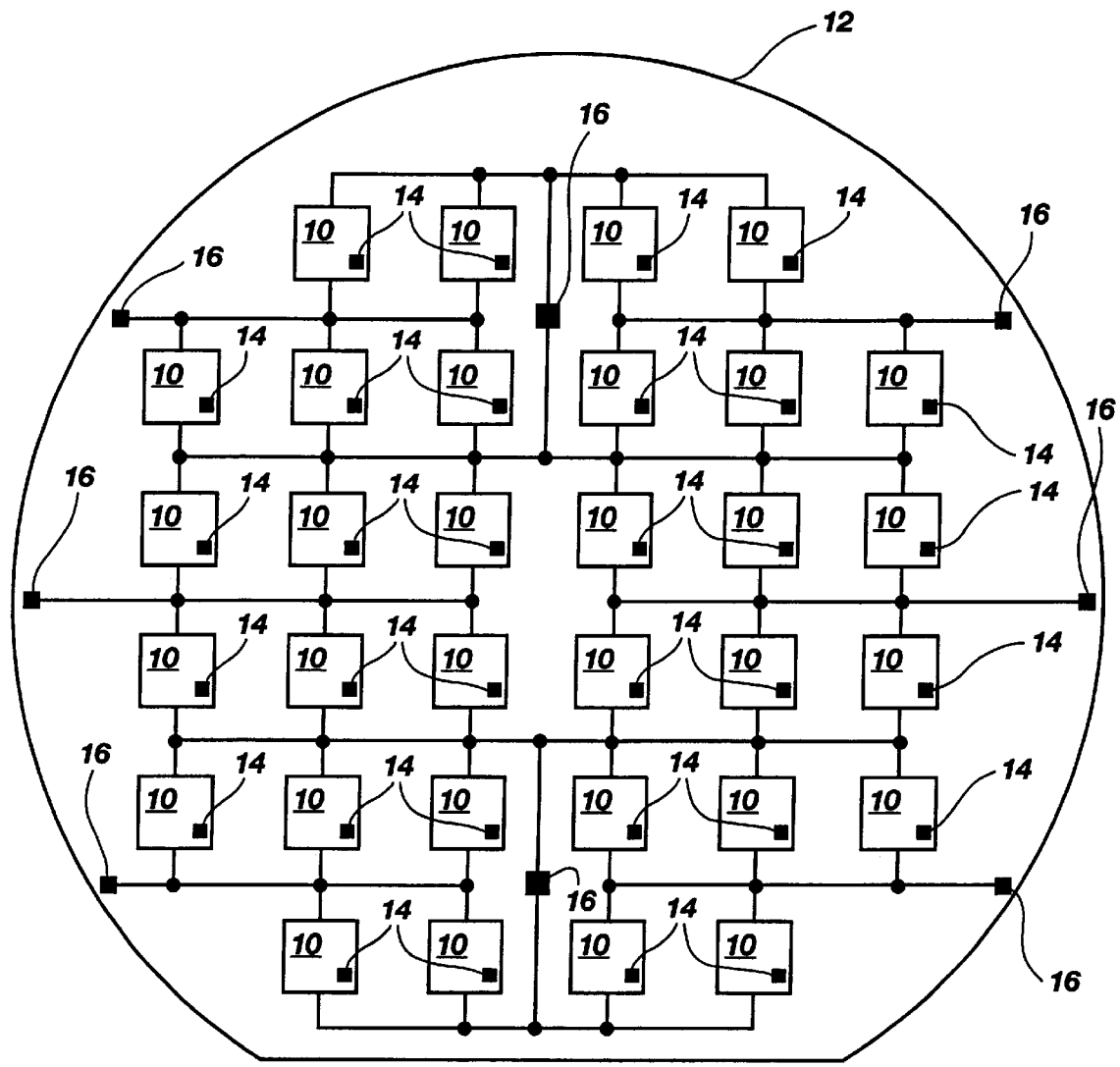
FIG. 1 is a top view of a conventional semiconductor wafer showing interconnected integrated circuits (ICs) formed on the surface of the wafer.
Figure 2:
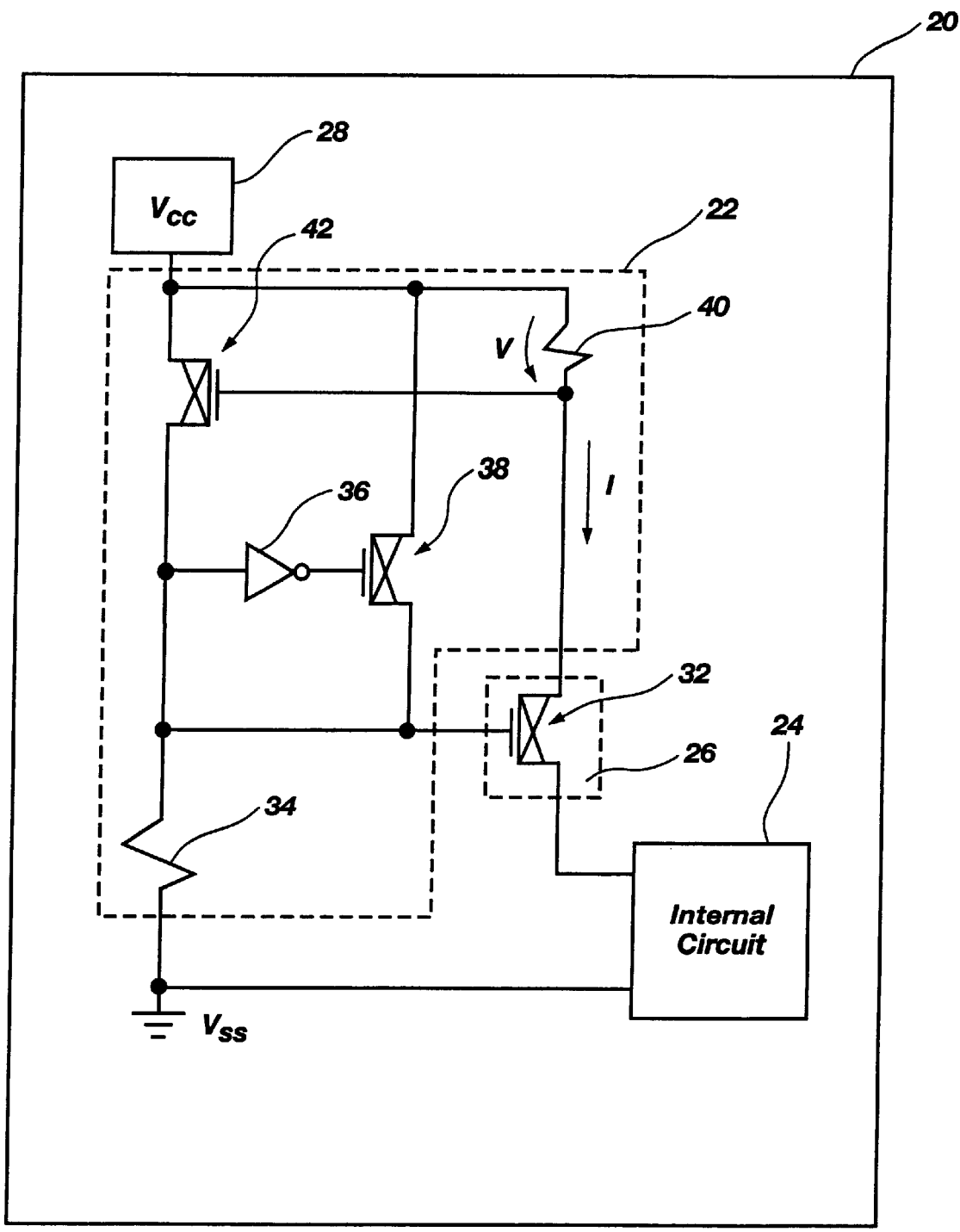
FIG. 2 is a block diagram and a schematic of an IC including circuitry for isolating a short-circuiting circuit internal to the IC from a supply voltage $V_{cc}$ bond pad on the IC in accordance with the present invention.

As shown in FIG. 2, an integrated circuit (IC) 20 in accordance with the present invention includes control circuitry 22 for sensing a short in a circuit 24 internal to the IC 20 and switching circuitry 26 for isolating the internal circuit 24 from a supply voltage $V_{cc}$ bond pad 28 on the IC 20 in response to the control circuitry 22 sensing the short. By isolating the short-circuited internal circuit 24 from the supply voltage $V_{cc}$ bond pad 28, the present invention can prevent the short from "tripping" probe test equipment (not shown) supplying the supply voltage $V_{cc}$ to a semiconductor wafer (not shown) during probe testing of the wafer.

It should be understood that the IC may comprise any IC, including, for example, a Dynamic Random Access Memory (DRAM) IC and a Static RAM (SRAM) IC. It should also be understood that although the control circuitry and switching circuitry will be described with respect to specific circuitry, the present invention includes within its scope any control circuitry and any switching circuitry capable of performing the functions as described. Also, although the control circuitry will be described as sensing the short in the internal circuit by sensing excess current drawn by the internal circuit, the control circuitry may instead be constructed to sense abnormally high or low voltages within the internal circuit indicative of a short circuit. Further, it should be understood that while the present invention is considered most applicable to probe testing, its applicability is not limited to probe testing. In addition, it should be understood that the present invention can be used to isolate short-circuiting internal circuitry of an IC from a wide variety of circuitry external to the IC, and thus is not limited to isolating internal circuitry from a supply voltage $V_{cc}$ bond pad.

Under normal probe testing conditions of the IC 20, when a short circuit does not exist in the internal circuit 24, a ground voltage $V_{ss}$ applied at the gate of a switching PMOS transistor 32 through a large resistance device 34 (e.g., more than 1 MΩ) turns the switching PMOS transistor 32 on. The ground voltage $V_{ss}$ is also applied at the input of an inverter 36, which then outputs a high voltage at the gate of a hysteresis PMOS transistor 38, causing the hysteresis PMOS transistor 38 to be off. Because the switching PMOS transistor 32 is on, the supply voltage $V_{cc}$ applied at the bond pad 28 causes a current I to flow through a sensing resistance device 40 and the switching PMOS transistor 32 to the internal circuit 24.

The amount of resistance R of the sensing resistance device 40 is selected so that, under normal probe testing conditions, the current I drawn by the internal circuit 24 causes a voltage drop V (equal to I×R) across the sensing resistance device 40 that is less than the threshold voltage $|V_T|$ of a sensing PMOS transistor 42. As a result, the sensing PMOS transistor 42 is off.

When a short circuit (e.g., a short circuit to ground) does exist in the internal circuit 24, the internal circuit 24 rapidly draws excessive current I through the sensing resistance device 40, causing the voltage drop V across the sensing resistance device 40 to exceed the threshold voltage $|V_T|$ of the sensing PMOS transistor 42. As a result, the sensing PMOS transistor 42 turns on, thereby applying the supply voltage $V_{cc}$ at the gate of the switching PMOS transistor 32 and at the input of the inverter 36. Application of the supply voltage $V_{cc}$ at the input of the inverter 36 causes the inverter 36 to output a low voltage at the gate of the hysteresis PMOS transistor 38, thereby turning the hysteresis PMOS transistor 38 on and reinforcing application of the supply voltage $V_{cc}$ at the gate of the switching PMOS transistor 32. This causes the switching PMOS transistor 32 to turn off, thereby interrupting the excessive current flow I and isolating the short-circuited internal circuit 24 from the bond pad 28.

Because the current flow I is interrupted, the voltage drop V across the sensing resistance device 40 drops to zero, causing the sensing PMOS transistor 42 to turn off. Despite this, the switching PMOS transistor 32 remains off, because feedback of the supply voltage $V_{cc}$ from the drain of the hysteresis PMOS transistor 38 to the input of the inverter 36 causes the inverter 36 to continue to output a low voltage at the gate of the hysteresis PMOS transistor 38, thereby causing the hysteresis PMOS transistor 38 to remain on and to continue to apply the supply voltage $V_{cc}$ to the gate of the switching PMOS transistor 32. The IC 20 remains in this state, with the short-circuited internal circuit 24 isolated from the bond pad 28, and hence from other ICs under test, by the switching PMOS transistor 32 until the supply voltage $V_{cc}$ is no longer applied to the bond pad 28, at which point the control circuitry 22 is reset.

Figure 3:
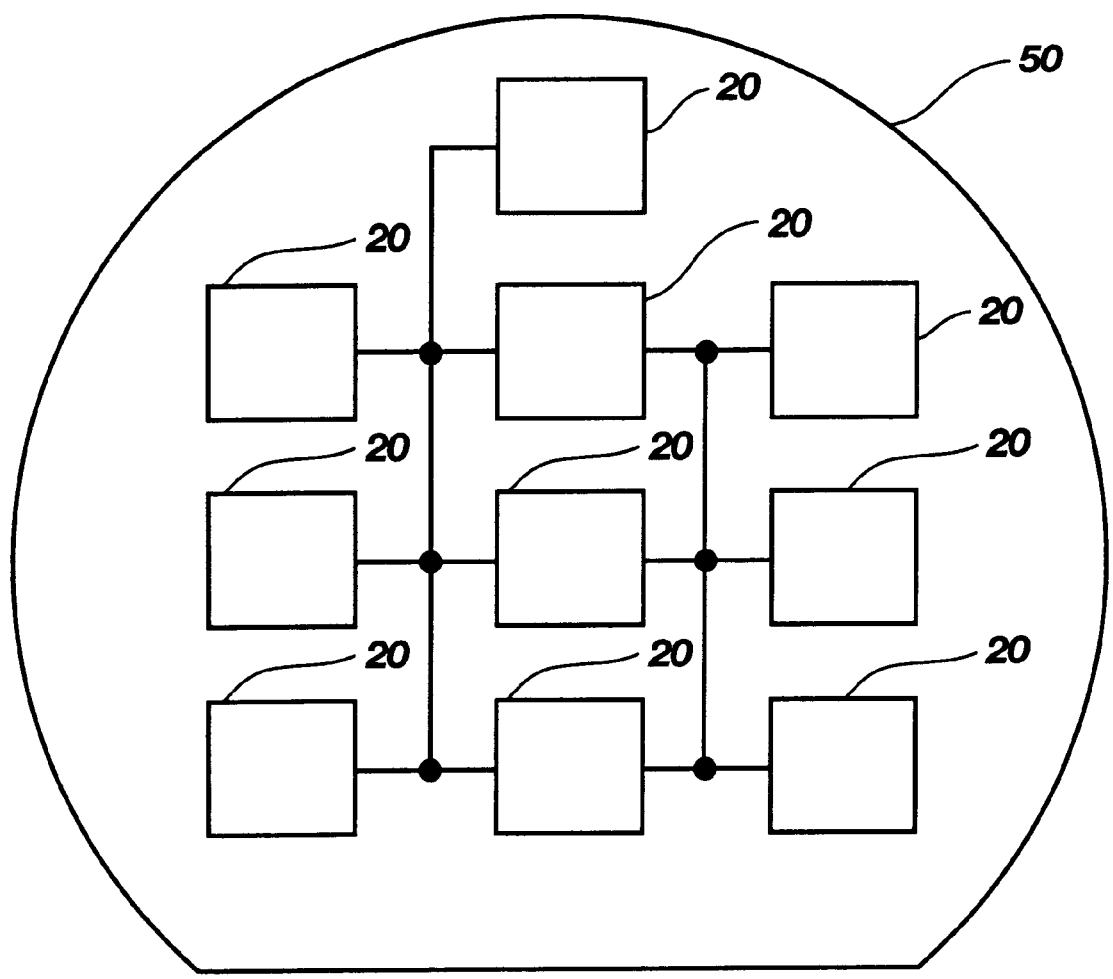
FIG. 3 is a top view of a semiconductor wafer including interconnected ICs formed on its surface that are identical to the IC shown in FIG. 2.
Figure 4:
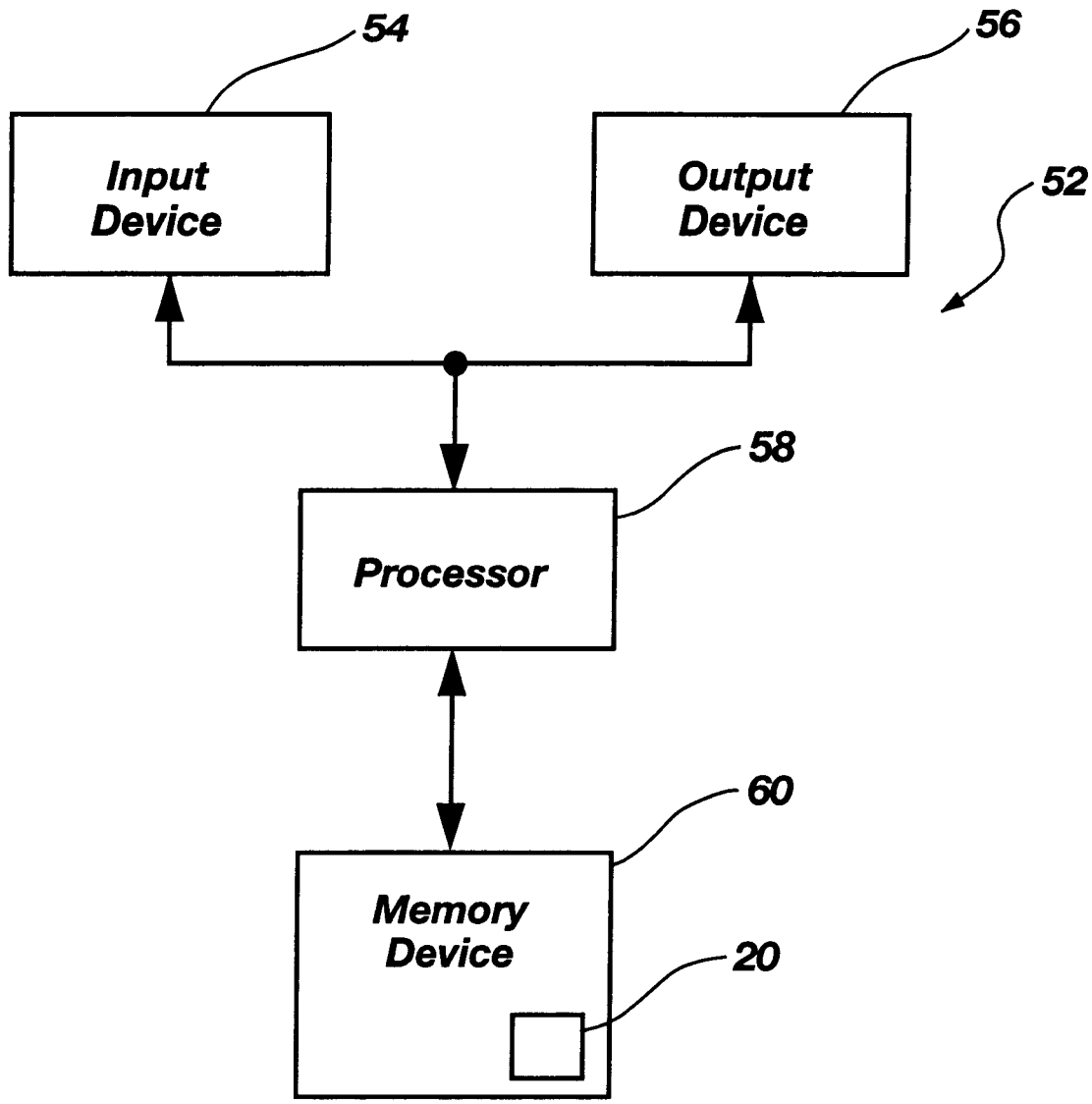
FIG. 4 is a block diagram of an electronic system including the IC of FIG. 2.

As shown in FIG. 3, multiple ICs 20 are formed and interconnected on the surface of a semiconductor wafer 50 in accordance with the present invention. As shown in FIG. 4, an electronic system 52, such as a computer system, includes an input device 54, an output device 56, a processor 58, and a memory device 60 incorporating the IC 20 of FIGS. 2 and 3.

Figure 5:
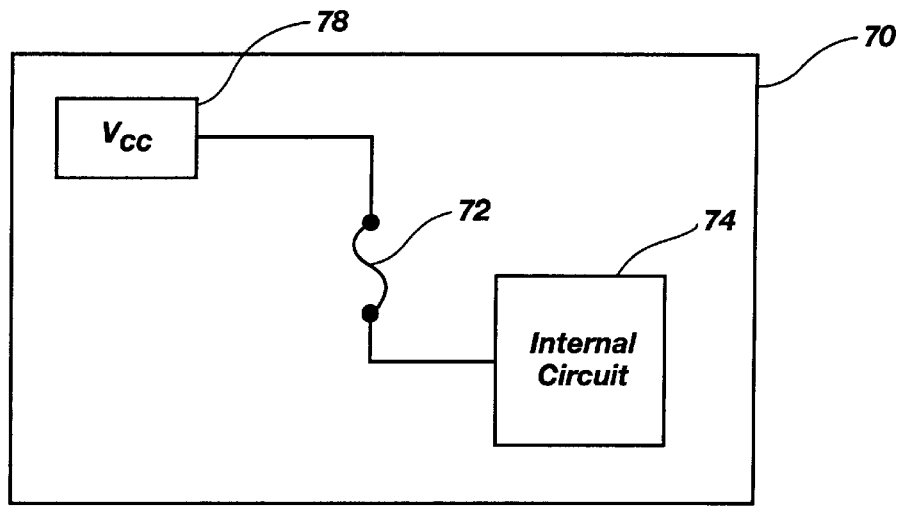
FIG. 5 is a block diagram and a schematic of an IC including an alternative embodiment of circuitry for isolating a short-circuiting circuit internal to the IC from a supply voltage $V_{cc}$ bond pad on the IC in accordance with the present invention.

As shown in FIG. 5, an IC 70 in accordance with an alternative embodiment of the present invention includes a fuse 72 for sensing a short in a circuit 74 internal to the IC 70 and for isolating the internal circuit 74 from a supply voltage $V_{cc}$ bond pad 78 on the IC 70 when excessive current is drawn by the short.

Figure 6:
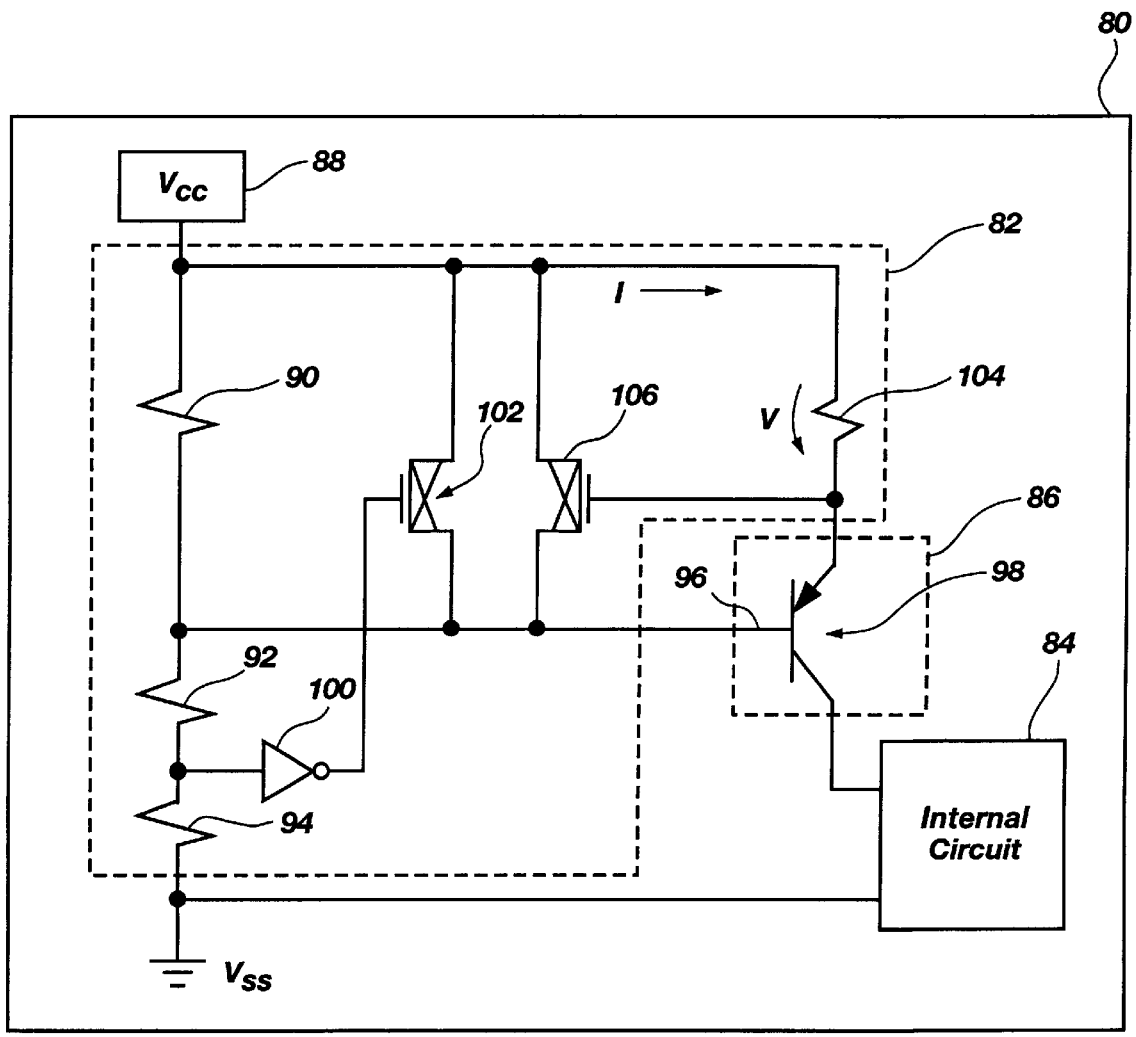
FIG. 6 is a block diagram and a schematic of another alternative embodiment of circuitry for isolating a short-circuiting circuit internal to an IC from a supply voltage $V_{cc}$ bond pad on the IC in accordance with the present invention.

As shown in FIG. 6 in another alternative embodiment of the present invention, an IC 80 includes control circuitry 82 for sensing a short in a circuit 84 internal to the IC 80 and switching circuitry 86 for isolating the internal circuit 84 from a supply voltage $V_{cc}$ bond pad 88 on the IC 80 in response to the control circuitry 82 sensing the short. By isolating the short-circuited internal circuit 84 from the supply voltage $V_{cc}$ bond pad 88, the present invention can prevent the short from "tripping" probe test equipment (not shown) supplying the supply voltage $V_{cc}$ to a semiconductor wafer (not shown) during probe testing of the wafer.

Under normal probe testing conditions of the IC 80, when a short circuit does not exist in the internal circuit 84, a series of biasing resistors 90, 92, and 94 biases the base 96 of a switching bipolar junction transistor (BJT) 98 at a voltage intermediate the supply voltage $V_{cc}$ and a ground voltage $V_{ss}$ so that the BJT 98 is on. A voltage taken from between the biasing resistors 92 and 94 and applied at the input of an inverter 100 causes the inverter 100 to output a high voltage to the gate of a hysteresis PMOS transistor 102, causing the hysteresis PMOS transistor 102 to be off. Because the switching BJT 98 is on, the supply voltage $V_{cc}$ applied at the bond pad 88 causes a current I to flow through a resistor 104 and the BJT 98 to the internal circuit 84.

The amount of resistance R of the resistor 104 is selected so that, under normal probe testing conditions, the current I drawn by the internal circuit 84 causes a voltage drop V (equal to I×R) across the resistor 104 that is less than the threshold voltage $|V_T|$ of a sensing PMOS transistor 106. As a result, the sensing PMOS transistor 106 is off.

When a short circuit (e.g., a short circuit to ground) does exist in the internal circuit 84, the internal circuit 84 rapidly draws excessive current I through the resistor 104, causing the voltage drop V across the resistor 104 to exceed the threshold voltage $|V_T|$ of the sensing PMOS transistor 106. As a result, the sensing PMOS transistor 106 turns on, thereby applying the supply voltage $V_{cc}$ at the base of the switching BJT 98 and raising the voltage applied at the input to the inverter 100. The rising voltage at the input of the inverter 100 causes the inverter 100 to output a low voltage at the gate of the hysteresis PMOS transistor 102, thereby turning the hysteresis transistor 102 on and reinforcing application of the supply voltage $V_{cc}$ at the base 96 of the switching BJT 98. This causes the switching BJT 98 to turn off, thereby interrupting the excessive current flow I and isolating the short-circuited internal circuit 84 from the bond pad 88.

Because the current flow I is interrupted, the voltage drop V across the resistor 104 drops to zero, causing the sensing PMOS transistor 106 to turn off. Despite this, the switching BJT 98 remains off, because the raised voltage at the input to the inverter 100 causes the inverter 100 to keep the hysteresis PMOS transistor 102 on, allowing the hysteresis PMOS transistor 102 to continue to apply the supply voltage $V_{cc}$ to the base 96 of the BJT 98. The IC 80 remains in this state, with the short-circuited internal circuit 84 isolated from the bond pad 88, and hence from other ICs under test, by the switching BJT 98 until the supply voltage $V_{cc}$ is no longer applied to the bond pad 88, at which point the control circuitry 82 is reset.

It should be understood that the switching BJT 98 may be implemented on the IC 80, as is shown in FIG. 6, in a BiCMOS configuration or, alternatively, may be implemented on a probe card contacting the bond pad 88 or between ICs on a semiconductor wafer.

Figure 7:
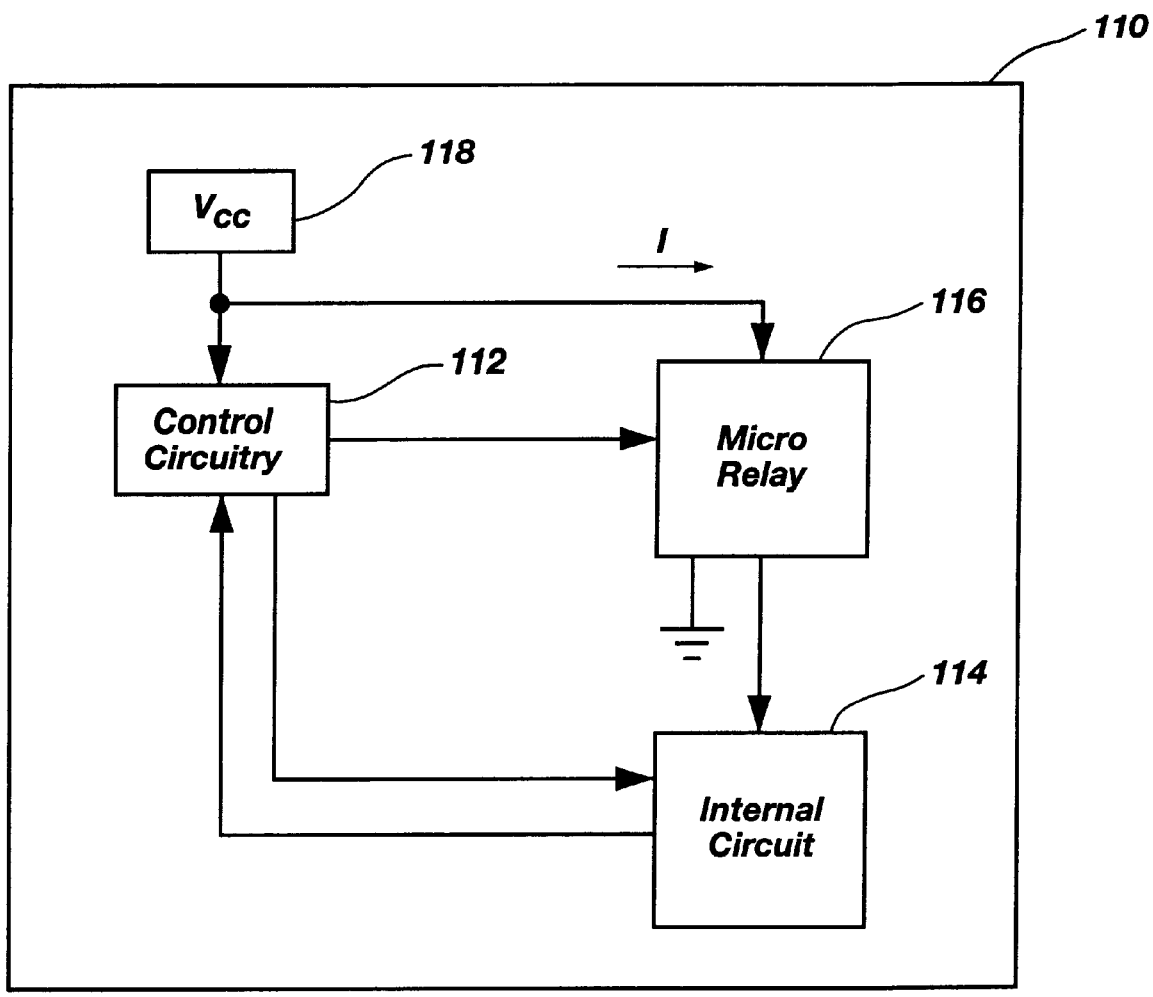
FIG. 7 is a block diagram and a schematic of still another alternative embodiment of circuitry for isolating a short-circuiting circuit internal to an IC from a supply voltage $V_{cc}$ bond pad on the IC in accordance with the present invention.

As shown in FIG. 7 in still another alternative embodiment of the present invention, an IC 110 includes control circuitry 112 for sensing a short in a circuit 114 internal to the IC 110 and a micro-relay 116 for isolating the internal circuit 114 from a supply voltage $V_{cc}$ bond pad 118 on the IC 110 in response to the control circuitry 112 sensing the short. By isolating the short-circuited internal circuit 114 from the supply voltage $V_{cc}$ bond pad 118, the present invention can prevent the short from "tripping" probe test equipment (not shown) supplying the supply voltage $V_{cc}$ to a semiconductor wafer (not shown) during probe testing of the wafer.

Under normal probe testing conditions of the IC 110, when a short circuit does not exist in the internal circuit 114, the control circuitry 112 senses no short in the internal circuit 114, so it causes the micro-relay 116 to close and allow a current I to flow to the internal circuit 114.

When a short circuit (e.g., a short circuit to ground) does exist in the internal circuit 114, the internal circuit 114 rapidly draws excessive current I. The control circuitry 112 detects this excessive current I and, as a result, causes the micro-relay 116 to open, thereby isolating the internal circuit 114 from the bond pad 118. The control circuitry 112 remains in this state until reset by the voltage at the bond pad 118 dropping to zero and then rising again to the supply voltage $V_{cc}$.

It should be understood that the micro-relay may be created using silicon micromachining techniques, and may comprise a capacitively or inductively controlled relay.

Although the present invention has been described with reference to particular embodiments, the invention is not limited to these described embodiments. For example, while the various steps of operating the inventive device, and hence the various steps of the inventive method, have been described as occurring in a particular order, it will be understood that these steps need not necessarily occur in the described order to fall within the scope of the present invention. Thus, the invention is limited only by the appended claims, which include within their scope all equivalent devices and methods that operate according to the principles of the invention as described.

What is claimed is:

1. In an integrated circuit (IC) having an internal circuit and an external terminal for communications between the internal circuit and circuitry external to the IC, a device for isolating the internal circuit from the external communications terminal, the device comprising:
   short-sensing control circuitry for sensing a short in the internal circuit and outputting a control signal in response thereto, the short-sensing control circuitry comprising:
   a first PMOS transistor having a source coupled to a supply terminal, a gate coupled to an output terminal, and a drain coupled to a control signal terminal;
   a first resistive device coupled between the supply terminal and the output terminal;
   a second resistive device coupled between the control signal terminal and a reference voltage bond pad;
   a second PMOS transistor having a source coupled to the supply terminal, a gate, and a drain coupled to the control signal terminal; and
   an inverter coupled between the control signal terminal and the gate of the second PMOS transistor; and
   switching circuitry coupled to the short-sensing control circuitry for isolating the internal circuit from the external communications terminal in response to receiving the control signal.

2. The device of claim 1 wherein the external communications terminal comprises a supply voltage bond pad for receiving a supply voltage from circuitry external to the IC, wherein the short-sensing control circuitry includes a supply terminal coupled to the supply voltage bond pad for receiving the supply voltage, an output terminal for outputting the received supply voltage, and a control signal terminal for outputting the control signal in response to a current flow between the supply terminal and the output terminal exceeding a predetermined threshold.

3. The device of claim 1 wherein the short-sensing control circuitry comprises circuitry for sensing current drawn by the internal circuit that exceeds a predetermined threshold and for outputting the control signal in response thereto.

4. The device of claim 1 wherein the short-sensing control circuitry comprises circuitry for sensing a voltage applied to the internal circuit that is below a predetermined threshold and for outputting the control signal in response thereto.

5. The device of claim 1 wherein the short-sensing control circuitry comprises circuitry for sensing a voltage applied to the internal circuit that is above a predetermined threshold and for outputting the control signal in response thereto.

6. An integrated circuit (IC) comprising:
   an external communications terminal;
   an internal circuit;
   switching circuitry coupled between the external communications terminal and the internal circuit for selectively isolating the internal circuit from the external communications terminal in response to receiving a control signal; and
   short-sensing control circuitry coupled to the external communications terminal and the switching circuitry for sensing a short in the internal circuit and outputting the control signal to the switching circuitry in response thereto, the short-sensing control circuitry comprising:
   a first PMOS transistor having a source coupled to a supply terminal, a gate coupled to an output terminal, and a drain coupled to a control signal terminal;
   a first resistive device coupled between the supply terminal and the output terminal;
   a second resistive device coupled between the control signal terminal and a reference voltage bond pad;
   a second PMOS transistor having a source coupled to the supply terminal, a gate, and a drain coupled to the control signal terminal; and
   an inverter coupled between the control signal terminal and the gate of the second PMOS transistor.

7. The IC of claim 6 wherein the external communications terminal comprises a supply voltage bond pad.

8. The IC of claim 6 wherein the internal circuit is selected from a group of circuits comprising a Dynamic Random Access Memory (DRAM) circuit and a Static RAM (SRAM) circuit.

9. A semiconductor wafer comprising a plurality of integrated circuits, each comprising:
 an external communications terminal;
 an internal circuit;
 switching circuitry coupled between the external communications terminal and the internal circuit for selectively isolating the internal circuit from the external communications terminal in response to receiving a control signal; and
 short-sensing control circuitry coupled to the external communications terminal and the switching circuitry for sensing a short in the internal circuit and outputting the control signal to the switching circuitry in response thereto, the short-sensing control circuitry comprising:
  a first PMOS transistor having a source coupled to a supply terminal, a gate coupled to an output terminal, and a drain coupled to a control signal terminal;
  a first resistive device coupled between the supply terminal and the output terminal;
  a second resistive device coupled between the control signal terminal and a reference voltage bond pad;
  a second PMOS transistor having a source coupled to the supply terminal, a gate, and a drain coupled to the control signal terminal; and
  an inverter coupled between the control signal terminal and the gate of the second PMOS transistor.

10. A method for testing integrated circuits (ICs) formed on a surface of a semiconductor wafer, the method comprising:
 providing short-sensing control circuitry within each IC for sensing a short in the IC, the short-sensing control circuitry comprising:
  a first PMOS transistor having a source coupled to a supply terminal, a gate coupled to an output terminal, and a drain coupled to a control signal terminal;
  a first resistive device coupled between the supply terminal and the output terminal;
  a second resistive device coupled between the control signal terminal and a reference voltage bond pad;
  a second PMOS transistor having a source coupled to the supply terminal, a gate, and a drain coupled to the control signal terminal; and
  an inverter coupled between the control signal terminal and the gate of the second PMOS transistor;
 testing the ICs; and
 when the short-sensing control circuitry in one of the ICs under test senses a short, automatically switchably isolating the IC with the short from other ICs.

11. The method of claim 10 wherein the providing short-sensing control circuitry comprises providing short-sensing control circuitry within each IC for sensing current drawn by the IC that exceeds a predetermined threshold.

12. The method of claim 10 wherein the providing short-sensing control circuitry comprises providing short-sensing control circuitry within each IC for sensing a voltage within the IC that is below a predetermined threshold.

13. The method of claim 10 wherein the providing short-sensing control circuitry comprises providing short-sensing control circuitry within each IC for sensing a voltage within the IC that is above a predetermined threshold.

14. The method of claim 10 wherein the testing the ICs comprises probe testing the ICs.

15. The method of claim 10 wherein the isolating the IC with the short from the other ICs comprises opening a switch in the IC with the short that couples internal circuitry therein to the other ICs.

16. A method for isolating a short-circuiting integrated circuit (IC) formed on a surface of a semiconductor wafer from other ICs formed on the surface of the wafer that are interconnected with the short-circuiting IC, the method comprising:
 sensing the short-circuiting IC, the short-sensing control circuitry comprising:
  a first PMOS transistor having a source coupled to a supply terminal, a gate coupled to an output terminal, and a drain coupled to a control signal terminal;
  a first resistive device coupled between the supply terminal and the output terminal;
  a second resistive device coupled between the control signal terminal and a reference voltage bond pad;
  a second PMOS transistor having a source coupled to the supply terminal, a gate, and a drain coupled to the control signal terminal; and
  an inverter coupled between the control signal terminal and the gate of the second PMOS transistor; and
 in response thereto, automatically switchably isolating the short-circuiting IC from the other ICs.

17. In an integrated circuit having an internal circuit, having a reference voltage bond pad, and having an external terminal for communication between the internal circuit and circuitry external to said integrated circuit, a device for isolating the internal circuit from said external terminal for communications, the device comprising:
 control circuitry for sensing a short in said internal circuit and outputting a control signal in response thereto, said control circuitry including a supply terminal coupled to said external terminal for communications for receiving a supply voltage, said external terminal comprising a supply voltage bond pad for receiving said supply voltage, an output terminal for outputting the supply voltage, and a control signal terminal for outputting a control signal in response to a current flow between the supply terminal and the output terminal exceeding a predetermined threshold, said control circuitry including:
  first PMOS transistor having a source coupled to the supply terminal, a gate coupled to the output terminal, and a drain coupled to the control signal terminal;
  a first resistive device coupled between the supply terminal and the output terminal;
  a second resistive device coupled between the control signal terminal and the reference voltage bond pad;
  a second PMOS transistor having a source coupled to the supply terminal, a gate, and a drain coupled to the control signal terminal; and
  an inverter coupled between the control signal terminal and the gate of the second PMOS transistor; and
 switching circuitry coupled to the control circuitry for isolating the internal circuit from said external terminal for communications in response to receiving the control signal.

* * * * *